United States Patent
Gu et al.

(10) Patent No.: US 10,455,202 B2
(45) Date of Patent: Oct. 22, 2019

(54) HEAT DISSIPATING APPARATUS AND ELECTRONIC DEVICE

(71) Applicant: Lenovo (Beijing) Co., Ltd., Beijing (CN)

(72) Inventors: Shulu Gu, Beijing (CN); Cheng Feng, Beijing (CN); Bo Tian, Beijing (CN)

(73) Assignee: LENOVO (BEIJING) CO., LTD., Beijing (CN)

( * ) Notice: Subject to any disclaimer, the term of this patent is extended or adjusted under 35 U.S.C. 154(b) by 0 days.

(21) Appl. No.: 15/586,544

(22) Filed: May 4, 2017

(65) Prior Publication Data

US 2017/0332517 A1  Nov. 16, 2017

(30) Foreign Application Priority Data

May 13, 2016 (CN) .......................... 2016 1 0320336
May 13, 2016 (CN) .......................... 2016 1 0320386
May 17, 2016 (CN) .......................... 2016 1 0326864

(51) Int. Cl.
*H04N 9/31* (2006.01)
*G06F 1/20* (2006.01)
*H02J 7/00* (2006.01)
*H05K 7/20* (2006.01)

(52) U.S. Cl.
CPC ............. *H04N 9/3144* (2013.01); *G06F 1/20* (2013.01); *H02J 7/0036* (2013.01); *H04N 9/3173* (2013.01); *H05K 7/20163* (2013.01); *H02J 7/0045* (2013.01)

(58) Field of Classification Search
CPC ...... H05K 7/20–20172; H05K 7/2089–20918; H05K 7/20454–20472; H05K 7/2049; H05K 7/154; H05K 7/20172; G06F 1/20–206; G06F 1/263; G06F 1/1658; H02J 4/00; H02J 7/0068; H04N 9/3144; Y10T 307/344
USPC ......... 361/679.46–679.54, 688–723; 307/23; 165/80.2–80.3; 257/718–719
See application file for complete search history.

(56) References Cited

U.S. PATENT DOCUMENTS

| | | | | |
|---|---|---|---|---|
| 5,930,110 A | * | 7/1999 | Nishigaki | G06F 1/1632 361/679.43 |
| 5,946,188 A | * | 8/1999 | Rochel | H01L 23/38 165/80.2 |
| 7,148,452 B2 | * | 12/2006 | Peterson | H05K 7/20918 219/443.1 |
| 7,903,405 B1 | * | 3/2011 | Miller | H05K 7/20145 361/689 |
| 9,679,275 B2 | * | 6/2017 | Bruscoe | G06Q 20/065 |

(Continued)

FOREIGN PATENT DOCUMENTS

CN   1550953 A    12/2004
CN   201229538 Y   4/2009
(Continued)

*Primary Examiner* — Dion Ferguson
*Assistant Examiner* — Amir A Jalali
(74) *Attorney, Agent, or Firm* — Anova Law Group, PLLC

(57) ABSTRACT

A heat dissipating apparatus includes a heat sink, a first air moving device coupled to a first end of the heat sink, and a second air moving device coupled to a second end of the heat sink. The first air moving device drives an airflow to move through the heat sink in a direction and the second air moving device drives the airflow to move through the heat sink in the direction.

21 Claims, 10 Drawing Sheets

(56) References Cited

U.S. PATENT DOCUMENTS

| | | | | |
|---|---|---|---|---|
| 2002/0167798 | A1* | 11/2002 | Jui-Yuan | H01L 23/3672 361/697 |
| 2003/0117772 | A1* | 6/2003 | Searls | H01L 23/3675 361/690 |
| 2004/0066623 | A1* | 4/2004 | Lu | G06F 1/20 361/697 |
| 2006/0019596 | A1* | 1/2006 | Su | G06F 1/206 454/184 |
| 2007/0169919 | A1* | 7/2007 | Deng | H01L 23/427 165/104.33 |
| 2008/0013280 | A1* | 1/2008 | Horng | H01L 23/4093 361/704 |
| 2008/0314556 | A1* | 12/2008 | Zhou | F28D 15/0266 165/80.3 |
| 2009/0141494 | A1* | 6/2009 | Zhang | F21K 9/00 362/249.03 |
| 2009/0314465 | A1* | 12/2009 | Zheng | H01L 23/38 165/80.3 |
| 2010/0014244 | A1* | 1/2010 | Cao | H01L 23/3672 361/679.48 |
| 2010/0032144 | A1* | 2/2010 | Yang | H01L 23/4006 165/121 |
| 2011/0102136 | A1* | 5/2011 | Nakashima | G06F 1/263 340/5.8 |
| 2011/0108250 | A1* | 5/2011 | Horng | G06F 1/28 165/121 |
| 2011/0267780 | A1* | 11/2011 | Thrailkill | F21V 29/004 361/709 |
| 2013/0083483 | A1* | 4/2013 | Wei | H01L 23/467 361/697 |
| 2013/0223012 | A1* | 8/2013 | Pierides | B23P 15/26 361/704 |
| 2013/0269920 | A1* | 10/2013 | Taketomi | F28F 3/02 165/185 |
| 2014/0361671 | A1* | 12/2014 | Degner | G06F 1/20 312/223.2 |
| 2015/0015070 | A1* | 1/2015 | Yakame | G06F 1/1658 307/23 |
| 2015/0208547 | A1* | 7/2015 | Gonzalez | H05K 7/20154 165/80.3 |
| 2015/0282381 | A1* | 10/2015 | Yampolsky | H05K 7/20127 165/185 |
| 2016/0049819 | A1* | 2/2016 | Butler | H02J 7/0054 320/105 |

FOREIGN PATENT DOCUMENTS

| | | |
|---|---|---|
| CN | 101764395 A | 6/2010 |
| CN | 201628888 U | 11/2010 |
| CN | 101943844 A | 1/2011 |
| CN | 102238845 A | 11/2011 |
| CN | 102968163 A | 3/2013 |
| CN | 104238693 A | 12/2014 |
| CN | 204065905 U | 12/2014 |
| JP | 2015164376 A | 9/2015 |
| TW | I274980 B | 3/2007 |

* cited by examiner

HEAT DISSIPATING APPARATUS AND ELECTRONIC DEVICE

CROSS-REFERENCES TO RELATED APPLICATIONS

This application claims priority to Chinese Patent Application No. 201610320336.5, filed on May 13, 2016, Chinese Patent Application No. 201610326864.1, filed on May 17, 2016, and Chinese Patent Application No. 2016103203863, filed on May 13, 2016, the entire contents of all of which are incorporated herein by reference.

FIELD OF THE DISCLOSURE

The present disclosure generally relates to the field of heat dissipation technology, and more particularly, to a heat dissipating apparatus, a heat dissipating method thereof, and an electronic device.

BACKGROUND

With the progresses of the technologies and manufactures, electronic devices such as personal computers (PCs) have become smaller and smaller, and have more and more functions. Meanwhile, the thermal density of the electronic devices is also increasing, and thus the heat dissipation has become more and more important. Effectively dissipating heat in a limited space becomes a key factor of designing a new electronic product.

At present, the small sized vertical. PCs generally apply a cooling scheme on a mobile platform, such as arranging a fan on the top or the bottom of a host to dissipate heat. However, such a cooling scheme has at least the following problems. The system internal airflow is not uniform. The noise is loud. The fan size can be too large.

BRIEF SUMMARY OF THE DISCLOSURE

In accordance with the disclosure, there is provided a heat dissipating apparatus including a heat sink, a first air moving device coupled to a first end of the heat sink, and a second air moving device coupled to a second end of the heat sink. The first air moving device drives an airflow to move through the heat sink in a direction and the second air moving device drives the airflow to move through the heat sink in the direction.

In accordance with the disclosure, there is provided an electronic device including a heat dissipating apparatus and a heat generating element. The heat dissipating apparatus includes a heat sink, a first air moving device coupled to a first end of the heat sink, and a second air moving device coupled to a second end of the heat sink. The first air moving device drives an airflow to move through the heat sink in a direction and the second air moving device drives the airflow to move through the heat sink in the direction. The heat generating element is coupled to the heat sink.

In accordance with the disclosure, there is provided a controlling method including detecting whether a first connection with a first power supply through an adapter is established to obtain a first detection result, obtaining a second detection result by detecting through an interface assembly whether a second connection with a second power supply is established, and generating a control instruction according to the first detection result and the second detection result.

BRIEF DESCRIPTION OF THE DRAWINGS

Various objectives, features, and advantages of the present disclosure can be more fully appreciated with reference to the detailed description of the present disclosure when considered in connection with the following drawings, in which like reference numerals identify like elements. The following drawings are merely examples for illustrative purposes according to various disclosed embodiments and are not intended to limit the scope of the present disclosure.

DETAILED DESCRIPTION

Embodiments will now be described in detail with reference to the accompanying drawings. The following description has been made only by way of example, but not to limit the present disclosure. Various embodiments of the present disclosure and various features in the embodiments that are not conflicted with each other can be combined and rearranged in various ways. Without departing from the spirit and scope of the disclosed embodiments, modifications, equivalents, or improvements to the disclosed embodiments are understandable to those skilled in the art and are intended to be encompassed within the scope of the present disclosure.

The term "and/or" can be simply a description of an association between objects, indicating that there may be three relationships between two objects. For example, "A and/or B" may indicate the following three possibilities: A exists alone, B exists alone, and both A and B exist. In addition, the symbol "/" may generally indicate an "or" relationship between objects.

Figure 1:
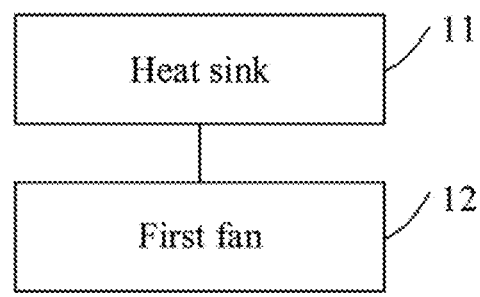
FIG. 1 illustrates a schematic structural diagram of an example of heat dissipating apparatus of an electronic device in accordance with some embodiments.

Referring to FIG. 1, a schematic structural diagram of an example of heat dissipating apparatus of an electronic device is shown in accordance with some embodiments.

As illustrated, the heat dissipating apparatus can include at least one heat sink 11 and a first air moving device 12.

The at least one heat sink 11 can be used for collecting the heat released by heat generating elements of the electronic device.

The first air moving device 12 can be connected to one end of the at least one heat sink 11 for driving an airflow to move upwardly in a vertical direction through the at least one heat sink 11 when the electronic device is in an operating state.

In some embodiments, the first air moving device 12 can be located at the bottom of the at least one heat sink 11 when the electronic device is in the operating state.

Accordingly, when the electronic device is in the operating state, the first air moving device 12 at the bottom can be used to apply a pressure to an upward airflow, which can cause the airflow to go through the heat sink 11 to dissipate the heat more easily, thereby improving a cooling rate.

In some embodiments, one heat sink 11 is provided and the heat sink can have a cylindrical shape, or be a portion of a cylinder.

In some other embodiments, a plurality of heat sinks 11 are provided and the plurality of heat sinks 11 can form a cylinder or a portion of a cylinder. The plurality of heat sinks 11 can include two or more heat sinks 11.

Based on the chimney effect, the at least one or more heat sinks 11 can have a cylindrical shape, or be a portion of a cylinder.

In general, the chimney effect refers to a phenomenon with an enhanced air convection caused by a rising or a falling airflow inside a space along a vertical slope. For example, a building or a structure (such as a water tower) with an unblocked flow channel from the bottom to the top, such as a vertical ventilation or exhaust duct, a stairways, etc., can have chimney-like features. That is, the air including flue gas can quickly spread or discharge from the building or the structure along the flow channel due to the density difference of the air.

Therefore, since the one or more heat sinks 11 have a cylindrical shape, or are a portion of a cylinder, they can dissipate the heat to the outside more easily. As such, the heat generating elements in the electronic device can maintain a good working condition, and the problems such as operating system instability, short device life, and electric device burning that caused by high temperature can be effectively avoided.

In some embodiments, the electronic device includes, but is not limited to, a small sized device or a vertical device, such as a small sized vertical personal computer (PC).

In some embodiments, the heat generating elements of the electronic device include, but are not limited to, a central processing unit (CPU), a graphic processing unit (GPU), a graphics card, a motherboard chipset, a hard disk, a power supply, an optical drive, a memory, and so on.

When the electronic device is in the operating state, the disclosed, heat dissipation apparatus can absorb the heat released from the heat generating elements and dissipate the heat quickly, thereby effectively improving the heat dissipation performance and reducing the internal noise of the system.

Figure 2:
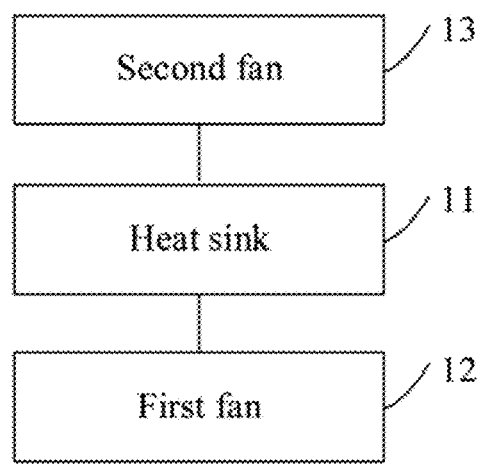
FIG. 2 illustrates a schematic structural diagram of another example of heat dissipating apparatus of an electronic device in accordance with some embodiments.

Referring to FIG. 2, a schematic structural diagram of another example of heat dissipating apparatus of an electronic device is shown in accordance with some other embodiments.

As illustrated in FIG. 2, the heat dissipating apparatus can include the at least one heat sink 11, the first air moving device 12, and a second air moving device 13.

The at least one heat sink 11 can be used for collecting the heat released by the heat generating elements of the electronic device.

The first air moving device 12 can be connected to a first end of the at least one heat sink 11 for driving an airflow to move upwardly in a vertical direction through the at least one heat sink 11 when the electronic device is in an operating state.

The second air moving device 13 can be connected to a second end of the at least one heat sink 11 for driving an airflow to move upwardly in a vertical direction when the electronic device is in an operating state.

In some embodiments, the first air moving device 12 can be located at the bottom of the at least one heat sink 11, and the second air moving device 13 can be located at the top of the at least one heat sink 11 when the electronic device is in the operating state.

In some embodiments, the first air moving device 12 at the bottom can be used to apply a pressure to an airflow going through the at least one heat sink 11 to move upward, and the second air moving device 13 at the top can be used to receive the airflow that has gone through the at least one heat sink 11 and to exhaust the airflow to the outside.

In some embodiments, the first air moving device 12 can be a fan. The second air moving device 13 can be a blower which can prevent an airflow from flowing back.

Accordingly, the first air moving device can cooperate with the second air moving device. The first air moving device can generate an airflow moving upward to go through the at least one heat sink, and the second air moving device can receive the airflow that has gone through the at least one heat sink and to exhaust the airflow to the outside. As such, the heat dissipation can be speeded up.

In the disclosed heat dissipation apparatus, the first air moving device can cooperate with the second air moving device to move the airflow upward in the vertical direction at a higher speed. As such, when the electronic device is in the operating state, the generated heat can be dissipated quickly, which can extend the life of the heat generating elements, and can enhance the user's experience.

Figure 3:
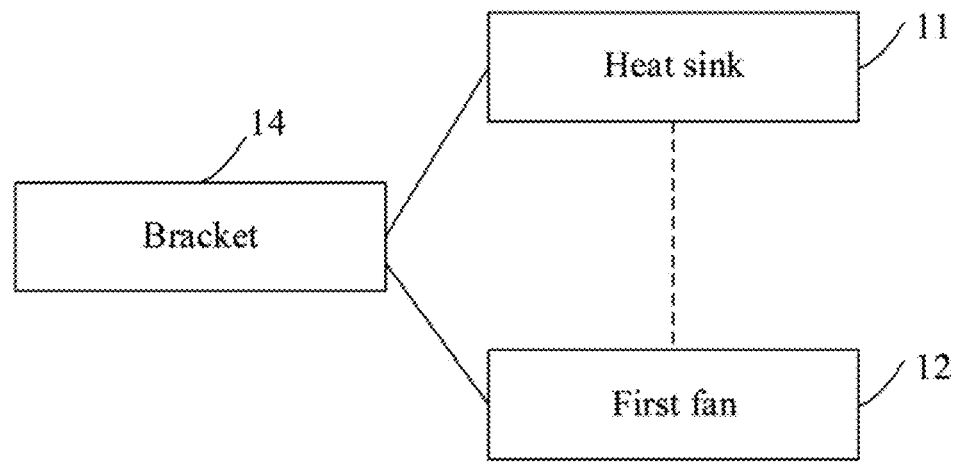
FIG. 3 illustrates a schematic structural diagram of another example of heat dissipating apparatus of an electronic device in accordance with some embodiments.

Referring to FIG. 3, a schematic structural diagram of another example of heat dissipating apparatus of an electronic device is shown in accordance with some other embodiments.

As illustrated in FIG. 3, the heat dissipating apparatus can include at least one heat sink 11, a first air moving device 12, and a bracket 14.

The at least one heat sink 11 can be used for collecting the heat released by the heat generating elements of the electronic device.

The first air moving device 12 can be connected to one end of the at least one heat sink 11 for driving an airflow to move upwardly in a vertical direction through the at least one heat sink 11 when the electronic device is in an operating state.

The bracket 14 can be used for fixing the at least one heat sink 11. The first air moving device 12 can be connected to the at least one heat sink 11 through the bracket 14.

In some embodiments, the first air moving device 12 can be located at the bottom of the bracket 14.

Accordingly, when the electronic device is in the operating state, the first air moving device 12 at the bottom of the bracket 14 can be used to apply a pressure to an upward airflow, which can cause the airflow to go through the heat sink 11 to dissipate the heat more easily, thereby improving a cooling rate.

In some embodiments, one heat sink 11 is provided and the heat sink can have a cylindrical shape, or be a portion of a cylinder.

In some other embodiments, a plurality of heat sinks 11 are provided and the plurality of heat sinks 11 can form a cylinder or a portion of a cylinder. The plurality of heat sinks 11 can include two or more heat sinks 11.

Since the one or more heat sinks 11 have a cylindrical shape, or are a portion of a cylinder, they can discharge the heat to the outside more easily, so that the heat generating elements in the electronic device can maintain a good working condition.

In some embodiments, a top surface or a bottom surface of the bracket 14 can have a triangular shape, a circular shape, an elliptical shape, or a polygonal shape.

The polygonal shape can include N sides, and N is a positive integer greater than or equal to four.

Thus, due to the multiple choices of the architecture of the bracket 14, it is possible to select a suitable shape for the bracket 14 based on the number of components included in the electronic device, so as to make a reasonable arrangement of the components based on the bracket 14. After the layout optimization, the electronic device can be smaller and more beautiful.

In some embodiments, the bracket 14 can include at least one sidewall. The sidewall can be a plane with respect to a plane of the top of the bracket 14 and a plane of the bottom of the bracket 14. For example, when the bracket 14 is a hollow cylindrical support without a top surface and/or a bottom surface, the bracket 14 includes one sidewall. When the bracket 14 is a triangular prismatic bracket without a top surface and/or a bottom surface, the bracket 14 includes three sidewalls.

The heat generating elements of the electronic device can be arranged on the outer surface of the at least one sidewall of the bracket 14. The at least one heat sink 11 can be arranged in an inner space of the bracket 14. The at least one heat sink 11 can be in contact with the heat generating elements through a pad. The pad may be a thermal pad.

In some embodiments, a material of the at least one sidewall of the bracket 14 may not affect the ability of at least one heat sink 11 to absorb the heat generated by the heat generating elements.

Accordingly, it is possible to reasonably arrange the components of the electronic device based on the at least one sidewall of the bracket 14.

In some embodiments, the at least one heat sink 11 can be fixed in the inner space of the bracket 14. The at least one heat sink 11 can be arranged in the inner space in accordance with a preset rule, such that the at least one heat sink 11 and the at least one sidewall can form at least one duct. The at least one duct can allow the airflow to move upwardly in a vertical direction. In some embodiments, the at least one duct can cause the airflow to have a speed larger than or equal to a predetermined value. As such, the airflow can be ensured to move in the at least one duct more smoothly.

When the electronic device is in the operating state, the disclosed heat dissipating apparatus can absorb the heat released from the heat generating elements, and can dissipate the heat quickly. At the same time, the disclosed heat dissipating apparatus can include a bracket. The components of the electronic device can be reasonably arranged based on the bracket, so that the electronic device can be smaller and more beautiful.

Figure 4:
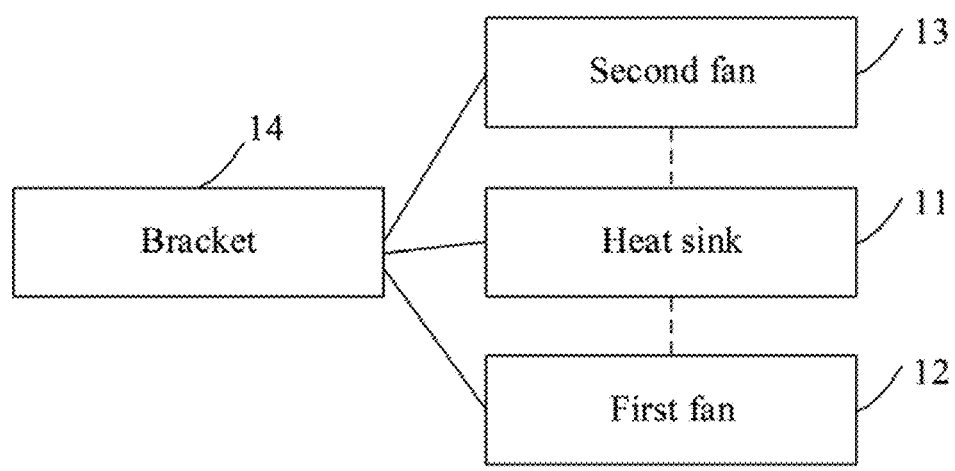
FIG. 4 illustrates a schematic structural diagram of another example of heat dissipating apparatus of an electronic device in accordance with some embodiments.

Referring to FIG. 4, a schematic structural diagram of another example of heat dissipating apparatus of an electronic device is shown in accordance with some other embodiments.

As illustrated in FIG. 4, the heat dissipating apparatus can include the at least one heat sink 11, the first air moving device 12, the second air moving device 13, and the bracket 14.

The at least one heat sink 11 can be used for collecting the heat released by the heat generating elements of the electronic device.

The first air moving device 12 can be connected to one end of the at least one heat sink 11 for driving an airflow to move upwardly in a vertical direction through the at least one heat sink 11 when the electronic device is in an operating state.

The second air moving device 13 can be connected to a second end of the at least one heat sink 11 for driving an airflow to move upwardly in a vertical direction when the electronic device is in an operating state.

The bracket 14 can be used for fixing the at least one heat sink 11. The first air moving device 12 and the second air moving device 13 can be connected to the at least one heat sink 11 through the bracket 14.

In some embodiments, the first air moving device 12 can be located at the bottom of the bracket 14, and the second air moving device 13 can be located at the top of the bracket 14.

In some embodiments, the first air moving device 12 at the bottom can be used to apply a pressure to an airflow going through the at least one heat sink 11 to move upward, and the second air moving device 13 at the top can be used to receive the airflow that has gone through the at least one heat sink 11 and to exhaust the airflow to the outside.

In some embodiments, the first air moving device 12 can be a fan. The second air moving device 13 can be a blower.

Accordingly, the first air moving device can cooperate with the second air moving device. The first air moving device can generate an airflow moving upward to go through the at least one heat sink, and the second air moving device can receive the airflow that has gone through the at least one heat sink and to exhaust the airflow to the outside. As such, the heat dissipation can be speeded up.

In some embodiments, the bracket 14 can have a frame structure. The top surface or the bottom surface of the bracket 14 can have a triangular shape, a circular shape, an elliptical shape, or a polygonal shape. The polygonal shape can include N sides, and N is a positive integer greater than or equal to four.

In some embodiments, at least one sidewall of the bracket 14 can include the at least one heat sink 11 and/or at least one heat generating element of the electronic device. For example, when the top surface or the bottom surface of the bracket 14 is triangular, the bracket 14 can be a triangular prism comprising nine supporting rods.

Accordingly, the components of the electronic device can be reasonably arranged based on the frame structure of the bracket 14. The frame structure of the bracket 14 can form a major airflow channel for heat dissipation.

When the electronic device is in the operating state, the disclosed heat dissipating apparatus can absorb the heat released from the heat generating elements, and can dissipate the heat quickly. At the same time, the disclosed heat dissipating apparatus can include a bracket. The components of the electronic device can be reasonably arranged based on the bracket, so that the electronic device can be smaller and more beautiful.

Figure 5:
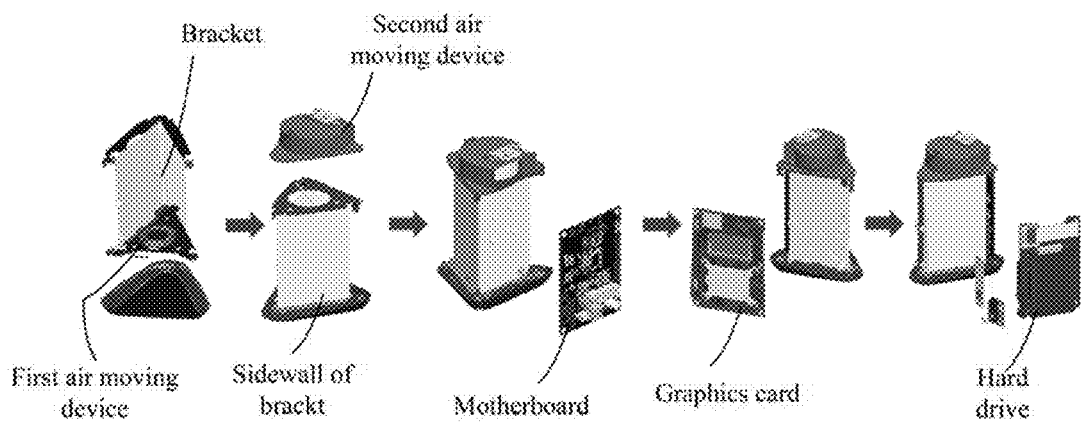
FIG. 5 illustrates a schematic exploded view of an example of heat dissipating apparatus of an electronic device in accordance with some embodiments.

Referring to FIG. 5, a schematic exploded view of an example of heat dissipating apparatus of an electronic device is shown in accordance with some embodiments.

As illustrated in FIG. 5, the bracket 14 can be a triangular prism bracket. The first air moving device 12 can be arranged at a bottom end of the bracket 14, and the second air moving device 13 can be arranged at a top end of the bracket 14. The heat generating elements of the electronic device, such as a motherboard, a graphics card, a hard drive, etc., can be respectively arranged on one side of the bracket 14.

Accordingly, the components of the electronic device can be reasonably arranged based on the bracket, so that the electronic device can be smaller and more beautiful. In particular, the heat dissipating performance of the electronic device can be improved.

In some embodiments, cold air can enter the electronic device through one or more ventilation holes. When the electronic device is in the operating state, the cold air can flow into the electronic device through one or more ventilation holes at the bottom of the electronic device.

The cold air can be evenly moved upwardly by the first air moving device at the bottom of the bracket. The airflow can be pressurized by the first air moving device and go through the inside of the electronic device, and can then be easily taken away by the second air moving device at the top of the bracket. Thus, the system noise can be reduced, and the system cooling performance can be enhanced by using the chimney effect.

According to some experiments, the use of a 2 L three-legged space bracket can at least solve the cooling problem of a 35-watt desktop CPU and a 45-watt graphics card.

Figure 6:
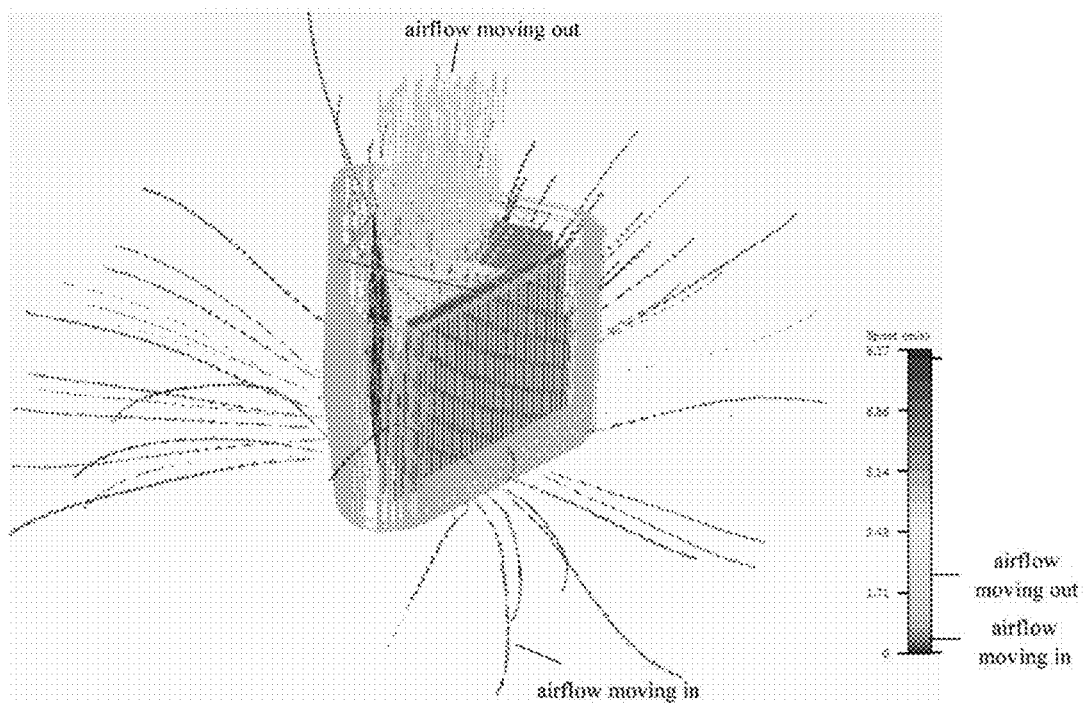
FIG. 6 illustrates a schematic diagram of a simulation result of heat dissipation using a heat dissipating apparatus in accordance with some embodiments.

Referring to FIG. 6, a schematic diagram showing a simulation result of heat dissipation using a heat dissipating apparatus consistent with the embodiment.

As illustrated in FIG. 6, the airflow moving into the electronic device and the airflow moving out of the electronic device are in full compliance with the cooling standards. Specifically, the airflow moving into the electronic device can have an airflow speed of 1.71 m/s or less. The airflow moving out from the electronic device can have an airflow speed of 3.43 m/s or less. Both of the airflow moving into the electronic device and the airflow moving out of the electronic device are within the cooling standards, and a good heat dissipation can be achieved.

Figure 7:
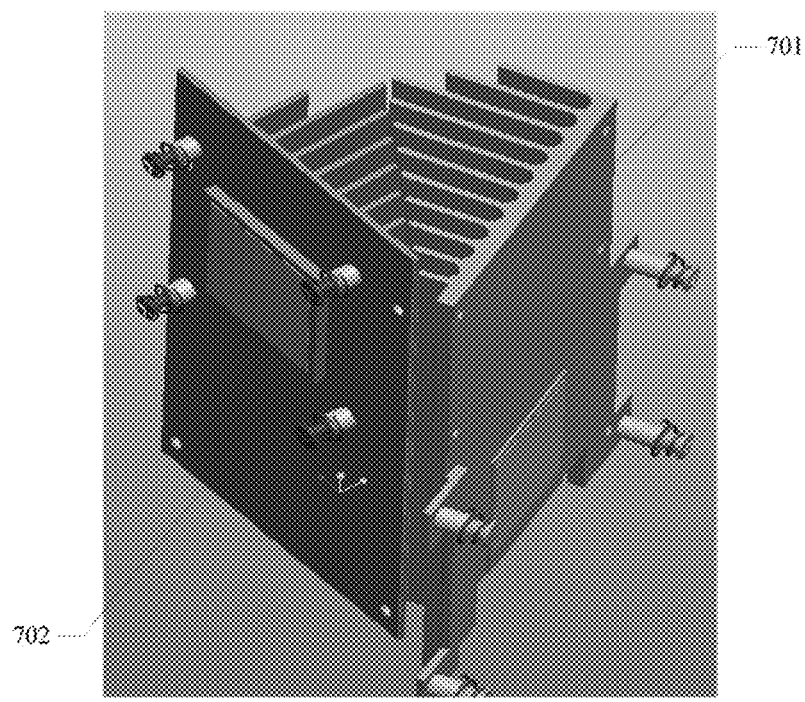
FIG. 7 illustrates a schematic structural diagram of an example of heat sink in a heat dissipating apparatus in accordance with some embodiments.
Figure 8:
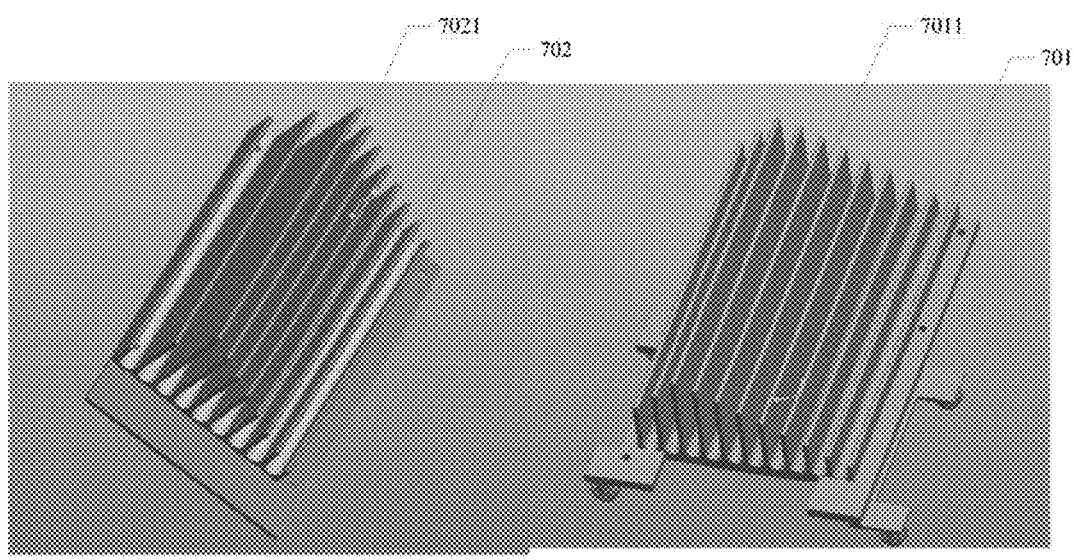
FIG. 8 illustrates a schematic structural diagram of an example of first heat sink and an example of second heat sink in accordance with some embodiments.

Referring to FIG. 7, a schematic structural diagram of an example of heat sink in a heat dissipating apparatus is shown in accordance with some embodiments. Referring to FIG. 8, schematic structural diagrams of an example of first heat sink and an example of second heat sink are shown in accordance with some embodiments.

As illustrated in FIGS. 7 and 8, the at least one heat sink can include a first heat sink 701 and a second heat sink 702.

The first heat sink 701 can be used for dissipating heat from a first heat generating device of the electronic device. The first heat sink 701 can be detachably and vertically disposed on a vertical system bracket of the electronic device.

The second heat sink 702 can be used for dissipating heat from a second heat generating device of the electronic device. The second heat sink 702 can be detachably and vertically disposed on the vertical system bracket of the electronic device. Further, a system motherboard of the electronic device can also be disposed on the vertical system bracket of the electronic device.

The vertical system bracket may be in one of various forms. For example, the vertical system bracket may be, e.g., a cylindrical bracket with a circular bottom surface, a tetrahedral bracket with a triangular bottom surface a triangular prismatic with a triangular bottom surface, or a polygonal column bracket with a polygonal bottom surface. In some embodiments, the vertical system bracket may not have a side surface. A heat sink can be used as a side surface of the vertical system bracket. Any suitable bracket that can stand uprightly can be used as the vertical system bracket.

In some implementations, the first heat sink can be operable to dissipate heat of the first heat generating device of the electronic device. That is, the first heat sink may be operatively mounted on a location of the vertical system bracket that corresponds to the location of the first heat generating device to dissipate heat. Similarly, the second heat sink may be operatively mounted on a location of the vertical system bracket that corresponds to the location of the second heat generating device to dissipate heat.

When two different heat sinks are disposed on the positions corresponding to the first heat generating device and the second heat generating device respectively, the first heat sink or the second heat sink can dissipate heat of the corresponding heat generating device of the electronic device.

Since the first heat sink and the second heat sink can be detachably and vertically provided on the vertical system bracket, the heat dissipating apparatus can optionally include the first heat sink and/or the second heat sink based on requirement. In some embodiments, the first heat sink, the second heat sink, the first heat generating device, the second heat generating device, and the system motherboard can be mounted on the vertical system bracket of the electronic device. Therefore, an overall appearance of the entire electronic device can have a vertical structure.

In the disclosed electronic device, at least two heat sinks can be vertically disposed on a vertical system bracket in a detachable manner. Thus, a heat dissipation function can be selectively provided to at least two heat generating elements. Therefore, the applicability of the heat dissipating apparatus of the vertical columnar electronic device can be improved.

In some embodiments, when the first heat sink and the second heat sink are disposed on the vertical system bracket, the first heat sink, the second heat sink, and the vertical system bracket can form a portion of a vertical columnar electronic device.

That is, when the heat dissipating apparatus, the system motherboard, and other external devices are disposed on the vertical system bracket, the overall appearance of the electronic device can include a vertical columnar structure. The bottom surface of the columnar structure device may be a circular surface, a triangular surface, a polygonal surface, etc., which may be set in the actual operation as needed.

The vertical columnar structure can be stable on the ground, and can have a larger internal space to accommodate more devices compared to the structure of another shape. The vertical columnar structure can have a smaller size in the horizontal direction, and is thus more suitable for a spatial layout. Further, a top surface of the vertical columnar structure can also be horizontal, thus other external devices can be placed above the top surface of the vertical columnar structure.

Therefore, in the disclosed electronic device, the first heat sink and the second heat sink can be disposed on the vertical system bracket. The vertical system bracket and the other external devices can be combined to form a portion of a vertical columnar structure. Therefore, the space capacity and the space suitability of the electronic device can be improved.

In some embodiments, the first heat sink and/or the second heat sink can form a part of a side surface of the vertical system bracket. As such, less material is needed for the vertical system bracket, and the spatial layout of the finally formed electronic device can be improved. Thus, potential circuit failures caused by closely arranged internal electronic components may be avoided, and the overall performance of the electronic device can be improved.

Therefore, the disclosed electronic device can have a more reasonable spatial layout and a reduced system failure rate.

In some embodiments, the first heat sink can include at least one first cooling fin 7011. In some embodiments, the first heat sink can include at least two first cooling fins 7011. The at least two first fins 7011 can have different heights. Adjacent two first cooling fins 7011 can form a duct.

In some embodiments, the second heat sink can include at least one second cooling fin 7021. In some embodiments, the second heat sink can include at least two second cooling fins 7021. The at least two second fins 7021 can have different heights. Adjacent two second cooling fins 7021 can form a duct.

As shown in FIGS. 7 and 8, in some embodiments, the first heat sink can include two or more first cooling fins as needed. The two or more first fins can have different heights, such that the first heat sink can be suitable for use with a corresponding heat generating element.

The two or more first fins can be approximately parallel to each other, thereby forming one or more heat dissipation passage for facilitating the air circulation and accelerating the heat dissipation process. The surfaces of the two or more first fins may be plane surfaces or curved surfaces. The two or more second fins of the second heat sink may have a same arrangement and structure as the two or more first fins of the first heat sink.

In the disclosed heat sink, two or more cooling fins can form one or more ducts which can accelerate heat dissipation. Thus, the disclosed heat sink can have an improved heat dissipation efficiency.

In some embodiments, a number of first cooling fins in the first heat sink can be equal to a number of second cooling fins in the second heat sink. Each of the first cooling fins in the first heat sink can have a same height as a corresponding second cooling fin in the second heat sink. As such, when the first heat sink and the second heat sink are disposed on the vertical system bracket, a duct can be formed between a pair of adjacent first cooling fin and second cooling fin.

As illustrated in FIG. 7, since each of the first cooling fins in the first heat sink has a same height as a corresponding second cooling fin in the second heat sink, the first heat sink and the second heat sink can be arranged in a relatively tilted form. As such, continuous ducts can be formed between the adjacent first cooling fins and second cooling fins. Therefore, the disclosed first heat sink and second heat sink can have an improved heat dissipation efficiency.

In some embodiments, the first heat sink can be used for cooling the central processing unit of the electronic device. A size of the first heat sink can be adapted to a size of the motherboard of the electronic device;

The second heat sink can be used for cooling the graphics processor of the electronic device. A size of the second heat sink can be adapted to a size of the graphics card of the electronic device.

In some actual implementations, the central processing unit and the graphics processor can generate more heat compared to other electronic components. Therefore, two dedicated heat sinks can be used for the heat dissipation of the central processing unit and the graphics processor.

That is, in the disclosed electronic device, two dedicated heat sinks can be provided for the central processing unit and the graphics processor. The sizes of the two heat sinks can be compatible with the motherboard and the graphics card, respectively. On the one hand, the material used for the heat sinks can be saved. On the other hand, the thermal efficiency can maximized.

Further, a user can freely decide whether or not to use the first heat sink or the second heat sink based on actual needs. Therefore, the disclosed electronic device can further improve the heat dissipation efficiency, save the application cost, and ensure a desirable heat dissipation performance.

Figure 9:
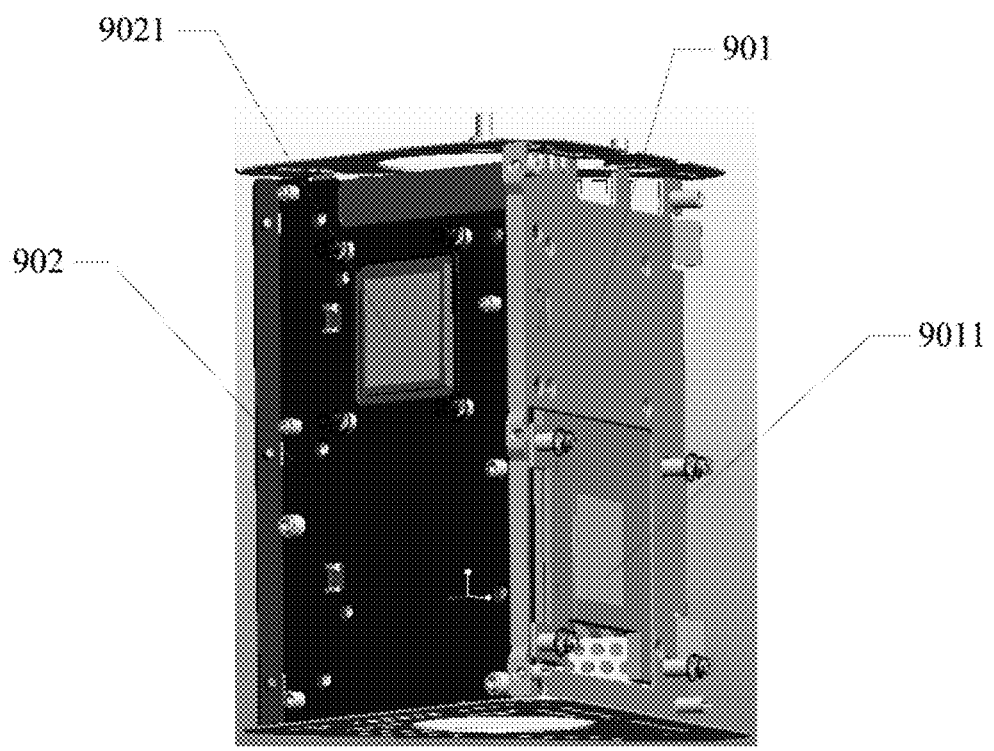
FIG. 9 illustrates a schematic structural diagram of an example of vertical system bracket in accordance with some embodiments.

Referring to FIG. 9, a schematic structural diagram of an example of vertical system bracket is shown in accordance with some embodiments. The vertical system bracket can have a columnar structure. A bottom side of the vertical system bracket can have a circular shape or a polygonal shape.

The vertical system bracket can include a first heat sink support piece 901 connected to a bottom edge of a first side of the vertical, system bracket for carrying the first heat sink, and a second heat sink support piece 902 connected to a bottom edge of a second side of the vertical system bracket for carrying the second heat sink.

In some embodiments, the first heat sink support piece 901 can include a first placement hole 9011 for placing the first heat sink. The second heat sink support piece 902 can include a second placement hole 9021 for placing the second heat sink.

In some embodiments, the first heat sink support piece 901 can further include a first mounting hole for mounting the first heat sink on the first heat sink support piece 901 through a thermal pad. The second heat sink support piece 902 can further include a second mounting hole for mounting the second heat sink on the second heat sink support piece 902 through a thermal pad.

In some embodiments, the vertical system bracket can further include a third support piece connected to a bottom edge of a third side of the vertical system bracket for carrying another hardware component of the electronic device.

The various embodiments and specific examples associated with the heat dissipating apparatus shown in FIG. 7 can be applicable to the vertical system bracket shown in FIG. 9. Those skilled in the art can understand the implementations of the disclosed vertical system bracket by reading the foregoing detailed description of the heat dissipating apparatus. For the sake of simplicity, the description is not repeated here.

Figure 10:
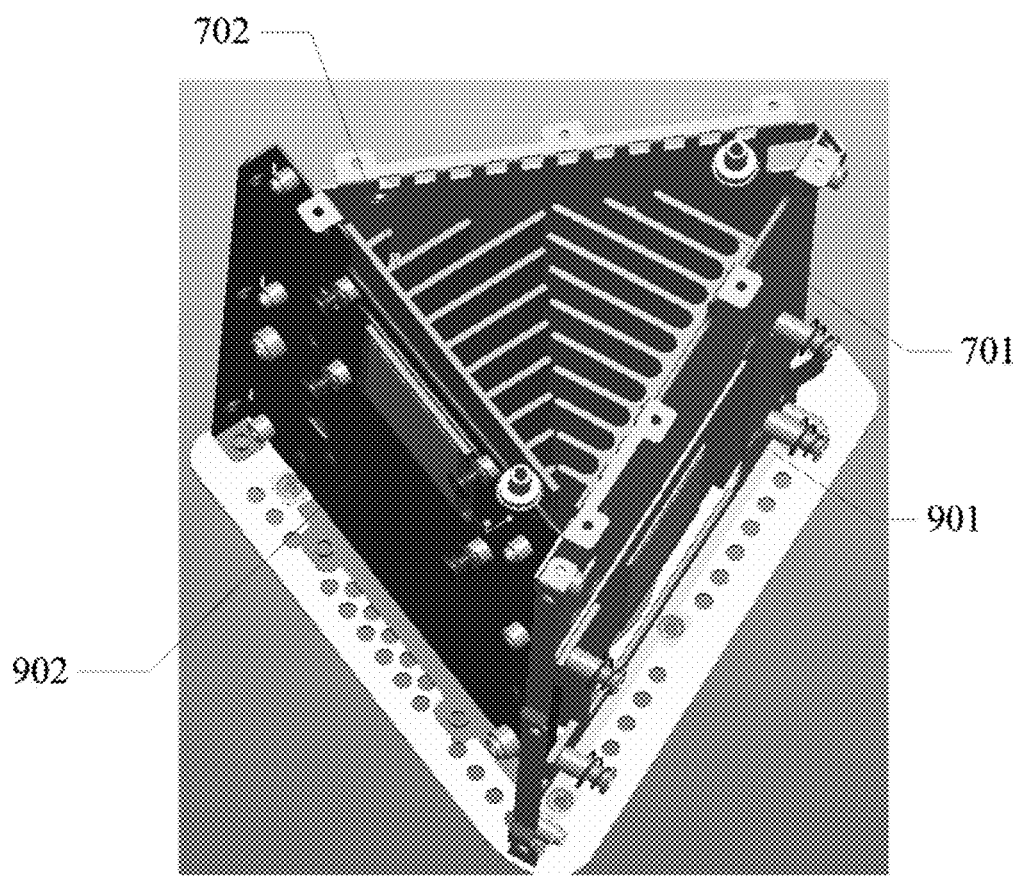
FIG. 10 illustrates a schematic configuration diagram of a processing apparatus in accordance with some embodiments.

Referring to FIG. 10, a schematic configuration diagram of an example of processing apparatus is shown in accordance with some embodiments.

As illustrated in FIG. 10, the processing apparatus can include a vertical system bracket, a motherboard disposed on the vertical system bracket, and a heat dissipating apparatus disposed on the vertical system bracket.

The various embodiments and specific examples associated with the heat dissipating apparatus and the vertical system bracket shown in FIGS. 7 and 9, respectively, can be applicable to the processing apparatus shown in FIG. 10. Those skilled in the art can understand the implementations of the disclosed processing apparatus by reading the foregoing detailed description of the heat dissipating apparatus and the vertical system bracket. For the sake of simplicity, the description is not repeated here.

Figure 11:
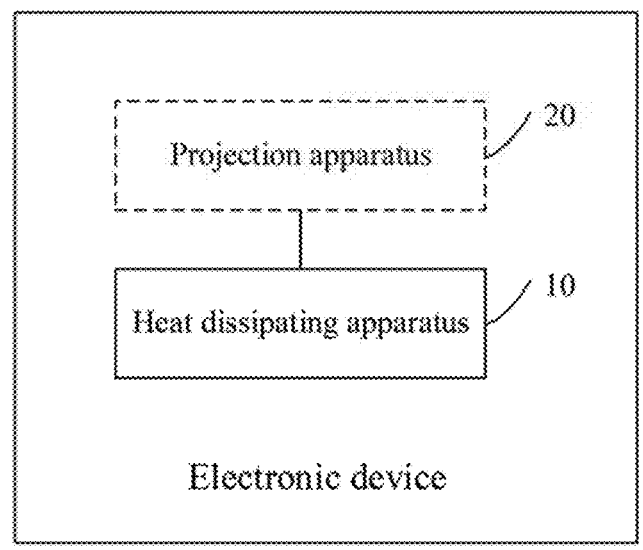
FIG. 11 illustrates a schematic structure diagram of an example of electronic device in accordance with some embodiments.

Referring to FIG. 11, a schematic structure diagram of an example of electronic device is shown in accordance with some embodiments.

As illustrated in FIG. 11, the electronic device can include a heat dissipating apparatus 10 for, when the electronic device is in an operating state, collecting the heat released by the heat generating elements of the electronic device through at least one heat sink, and using an air moving device to drive an airflow to move upwards through the at least one heat sink in a vertical direction.

Specifically, the description above in connection with FIGS. 1-4 can be referred to for the configuration and structure of the heat dissipation apparatus 10.

In some embodiments, at least one ventilation hole can be provided at each of a first end and a second end of the electronic device. The at least one ventilation hole at the first end can correspond to the first air moving device, and the at least one ventilation hole at the second end can correspond to the second air moving device.

As such, the cold air can enter from the at least one ventilation hole at the first end of the electronic device. That is, when the electronic device is in an operating state, the cold air can enter the electronic device from the at least one ventilation hole at the bottom. The airflow can evenly move upwards as driven by the first air moving device at the bottom. The airflow pressurized by the first air moving device at the bottom can go through the inner space of the electronic device, and can then be easily taken away by the second air moving device at the top. Therefore, the system noise can be reduced, and the system cooling performance can be enhanced by using the chimney effect.

In some embodiments, the electronic device can further include a projection apparatus 20 provided on a first side of the heat dissipating apparatus 10. The projection apparatus 20 can be used for acquiring and displaying information of the electronic device that is to be displayed.

In some embodiments, the first side is a top side of the heat dissipating apparatus 10.

As described above, the heat generating elements of the electronic device, including various processors, can be disposed around the heat dissipating apparatus 10. The projection apparatus 20 can be disposed on the top of the heat dissipating apparatus 10 to obtain processing information of the electronic device. The to-be-displayed information can be displayed by the projection apparatus 20, thereby improving the user experience.

For example, when the electronic device has a small vertical structure, a display may not be needed to be disposed around the heat dissipating apparatus 10. The function of the display can be realized by the projector 20, and the to-be-displayed information can be projected to a desktop or a wall. As such, the disclosed electronic device can both have a small volume requirement and function as a PC.

In some embodiments, the electronic device can further include a processing apparatus.

The processing apparatus can include a first transmission module, a first connector for establishing a first signal connection with a second connector of the projection apparatus, and a processor disposed on a motherboard. The processor can be used for obtaining second identification information of a second transmission module in, the projection apparatus through the first signal connection, and establishing a second signal connection with the projection apparatus based on first identification information of the first transmission module and the second identification information.

In some embodiments, the processor may be a general purpose central processing unit (CPU), an application specific integrated circuit (ASIC), or one or more integrated circuits for controlling program execution.

Further, the electronic device can further include one or more memories. The one or more memories may include a read only memory (ROM), a random access memory (RAM), and/or a disk memory.

In some embodiments, the first transmission module can be configured to transmit a video signal from the electronic apparatus to another electronic apparatus through the second signal connection. In these embodiments, the disclosed electronic apparatus can also be referred to as a "first electronic apparatus" and the other electronic apparatus can also be referred to as a "second electronic apparatus."

In some embodiments, the processor can be configured to write the second identification information into the first transmission module, to read identification information from the first transmission module, and to use the read identification information as the second identification information, and to establish the second signal connection based on the first identification information and the second identification information.

In some embodiments, the first connector can be farther configured to transmit an electronic current signal through the first signal connection after the first signal connection is established.

In some embodiments, the first transmission module and the second transmission module are wireless high definition (WIHD) transmission modules.

In some embodiments, the projection apparatus can be located at a predetermined position above the processing apparatus.

That is, the processing apparatus can be used as a system processing unit of a computer system, which can cooperate with the projection apparatus that can be used as a display corresponding to the computer system.

The various embodiments and specific examples of the heat dissipating apparatus and the vertical system bracket shown in FIGS. 7 and 9 can be applicable to the electronic device shown in FIG. 11. Those skilled in the art can understand the implementations of the disclosed electronic device by reading the foregoing detailed description of the heat dissipating apparatus and the vertical system bracket. For the sake of simplicity, the description is not repeated here.

In the disclosed electronic device, at least two heat sinks can be vertically disposed on a vertical system bracket in a detachable manner. Thus, a heat dissipation function can be selectively provided to at least two heat generating elements. Therefore, the applicability of the heat dissipating apparatus of the vertical columnar electronic device can be improved.

Further, in the disclosed electronic device, the first heat sink and the second heat sink can be disposed on the vertical system bracket. The vertical system bracket and the other external devices can be combined to form a portion of a vertical columnar structure. Therefore, the space capacity and the space suitability of the electronic device can be improved.

Further, in the disclosed electronic device, the first heat sink and/or the second heat sink can form a part of a side surface of the vertical system bracket. As such, less material is needed for the vertical system bracket can be reduced, and the spatial layout of the finally formed electronic device can be improved. Thus, potential circuit failures caused by closely arranged internal electronic components may be avoid, and the overall performance of the electronic device can be improved. Therefore, the disclosed electronic device can have a more reasonable spatial layout and a reduced system failure rate.

Further, the disclosed electronic device can be connected with a lost electronic apparatus based on a communication request from a second electronic apparatus. The electronic device can remotely control the functions of the lost apparatus by sending communication signals. As such, a response of the lost apparatus can be obtained at any time as needed. Therefore, it can be more convenient to retrieve the lost apparatus, to improve the probability of recovering the lost apparatus, and to enhance the user experience.

Further, in the disclosed electronic device, two or more cooling fins of the heat sink can form one or more ducts which can accelerate heat dissipation. Thus, the disclosed electronic device can have an improved heat dissipation efficiency.

Further, in the disclosed electronic device, each of the first cooling fins in the first heat sink has a same height as a corresponding second cooling fin in the second heat sink, the first heat sink and the second heat sink can be arranged in a relatively tilted form. As such, continuous ducts can be formed between the adjacent first cooling fins and second cooling fins. Therefore, the disclosed first heat sink and second heat sink can have an improved heat dissipation efficiency.

Further, in the disclosed electronic device, dedicated heat sinks can be provided for the central processing unit and the graphics processor. The sizes of these heat sinks can be compatible with the motherboard and graphics card, respectively. On the one hand, the material used for the heat sinks can be saved. On the other hand, the thermal efficiency can maximized.

Further, a user can freely decide whether or not to use the first heat sink or the second heat sink based on actual needs. Therefore, the disclosed electronic device can further improve the heat dissipation efficiency, save the application cost, and ensure a desirable heat dissipation performance.

Figure 12:
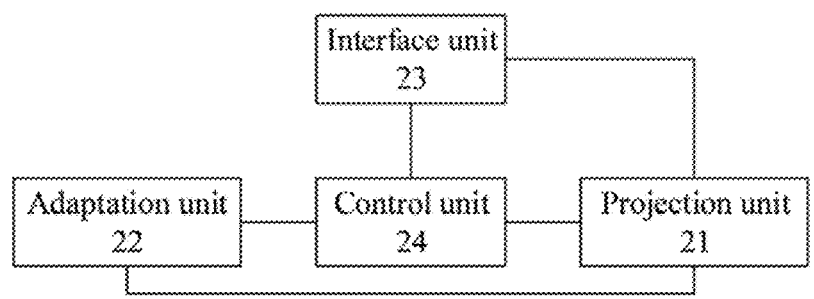
FIG. 12 illustrates a schematic structure diagram of another example of electronic device in accordance with some embodiments.

Referring to FIG. 12, a schematic structural diagram of another example of electronic device is shown in accordance with some other embodiments.

As illustrated in FIG. 12, the electronic device can include a projection unit (i.e., projector) 21, an adaptation unit (i.e., adaptor) 22, an interface unit (i.e., interface device) 23, and a control unit (i.e., controller) 24.

The projection unit 21 can be configured for projecting an image onto a projection surface using light emitted by a light source, and acquiring electric power through the adaptation unit 22 or acquiring power from a second power supply unit (i.e., a second power supply).

The adaptation unit 22 can be configure for establishing a connection with a first power supply unit (i.e., a first power supply).

The interface unit 23 can be configured for detecting whether a connection with the second power supply unit is established. The first power supply unit can be different from the second power supply unit. For example, the first power supply unit can be a power supply unit having a voltage conversion function while the second power supply unit can be a power supply unit having at least a power storage function.

The control unit 24 can be configured for detecting a first detection result indicating whether the adaptation unit 22 obtains electric power from the first power supply unit, and for receiving a second detection result from the interface unit 23 that indicates whether the connection with the second power supply unit is established. The control unit 24 can be further configured for generating a control instruction directed to the second power supply unit based on the first detection result and the second detection result.

In some embodiments, the first power supply unit may be a power supply unit that supplies electric power through an AC electrical interface. For example, the first power supply unit can provide a 220V AC power.

In some embodiments, the second power supply unit may be a power storage device, such as a power bank. The second power supply unit may have charging and discharging functions.

Further, the detection of whether the adaptation unit 22 obtains electric power from the first power supply unit may include a detection on a DC-IN pin of the adaptation unit 22. For example, when DC-IN=0, it can be determined that the adaptation unit 22 is not connected with the first power supply unit. When DC-IN=20, it can be determined that the adaptation unit 22 is connected with the first power supply unit. The unit of DC-IN may be voltage V.

In some embodiments, when the second power supply unit is connected to the interface unit, the adaptation unit can obtain power from the first power supply unit and can supply power to the second power supply unit through the interface unit to charge the second power supply unit.

In some embodiments, when the first detection result indicates that power is acquired from the first power supply unit and the second detection result indicates that the connection with the second power supply unit is established, the control unit can generate a first control instruction for controlling the charging of the second power supply unit.

In the above scenario, in addition to charging the second power supply unit by the control unit control, the power acquired by the adaptation unit from the first power supply unit can also be used to power the projection unit.

The control unit can use the first control instruction to control the charging of the second power supply unit. In some embodiments, according to the first control instruction, the control unit can divide the electric power obtained from the first power supply unit based on a preset ratio. As such, one portion of the electric power, also referred to as "charging power," can be used for charging the second power supply through the interface unit.

The preset ratio may be preset according to an actual situation. For example, the preset ratio can be 1:1. That is, one half of the acquired electric power can be used to power the projection unit, and the other half of the acquired electric power can be used to charge the second power supply unit. The above-mentioned ratio is only an example. Any other suitable preset ratio may be used during actual implementation.

Figure 13:
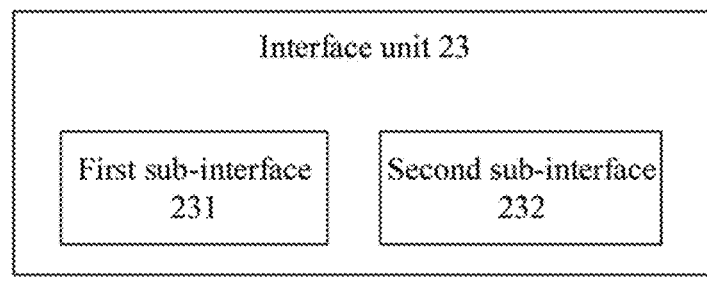
FIG. 13 illustrates a schematic block diagram of an example of interface unit in accordance with some embodiments.

Referring to FIG. 13, a schematic block diagram of an example of the interface unit 23 is shown in accordance with some embodiments.

As illustrated in FIG. 13, the interface unit 23 can include at least a first sub-interface 231 and a second sub-interface 232.

The first sub-interface 231 can be configured for detecting whether the connection with the second power supply unit is established.

The second sub-interface 232 can be configured for supplying electric power to the second power supply unit to charge the second power supply unit.

In addition, the interface unit 23 can further include a fourth sub-interface and/or a fifth sub-interface for grounding.

Further, the first sub-interface can use a voltage parameter to detect whether the connection with the second power supply unit is established. For example, when a voltage detected by the first sub-interface is about 3V, it can be determined that a connection to the second power supply unit is established. Otherwise, it can be determined that there is no connection to the second power supply unit.

Figure 14:
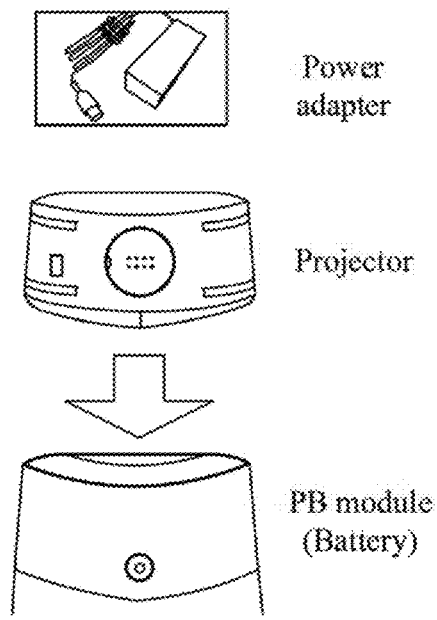
FIG. 14 illustrates a schematic diagram of an example of application scenario in accordance with some embodiments.

Referring to FIG. 14, a schematic diagram of an example of application scenario is shown in accordance with some embodiments. As illustrated in FIG. 14, the application scenario can include three parts, i.e., a projector module, a battery, i.e., a power bank (PB) module, and a power adapter. The power adapter can be used to power the projector.

Figure 15:
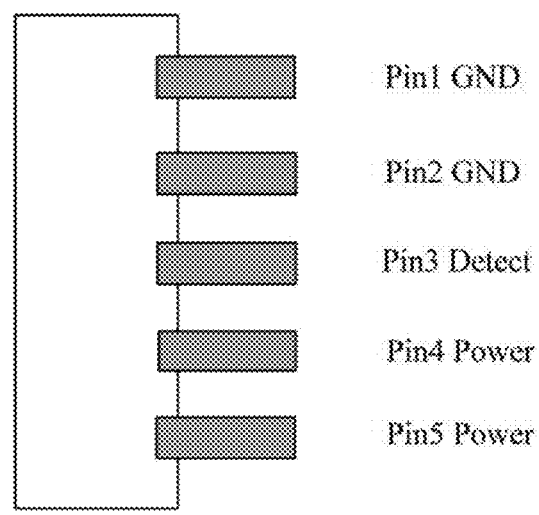
FIG. 15 illustrates a schematic diagram showing examples of interfaces in accordance with some embodiments.

Referring to FIG. 15, a schematic structure diagram of examples of interfaces is shown in accordance with some embodiments.

As illustrated in FIG. 15, the projector can include five pogo pins. The projector can charge the PB through the pogo pins, and can also be powered by the PB to operate when the projector is not connected to the power adapter.

The PB can include five pogo pins corresponding to the five pogo pins of the projector. Through the coupling between the pogo pins of the PB and the pogo pins of the projector, the PB can supply power to the projector, or be charged by the projector.

In some embodiments, as shown in FIG. 15, the projector includes a total of five interfaces. The interface Pin1 and the interface Pin2 can be grounded (GND). The interface Pin3 can be used as the first sub-interface to detect whether the projector is connected with the PB. The interface Pin4 and/or the interface Pin5 can be used as the second sub-interface for providing power to the PB.

Figure 16:
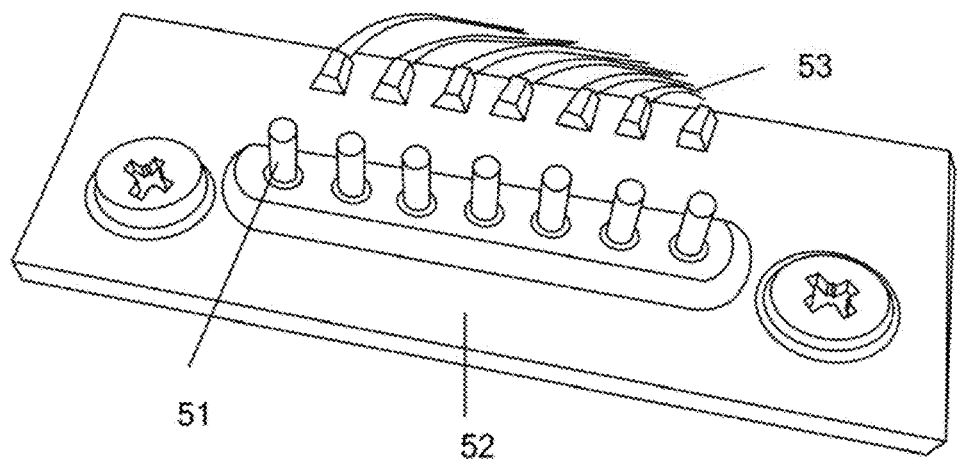
FIG. 16 illustrates a schematic structural diagram of an example of interface unit in accordance with some embodiments.

Referring to FIG. 16, a schematic structural diagram of an example of interface unit is shown in accordance with some embodiments.

As illustrated in FIG. 16, the interface unit includes a plurality of sub-interfaces 51, each of which can include a metal pin with a diameter of about 1 mm and a length of about 6 mm. The sub-interlaces 51 can be fixed by a plastic bracket 52 to a printed circuit board (PCB), and can be connected to a main control board via cables 53. In the example shown in FIG. 16, the PCB is inside the plastic bracket 52 and is therefore not shown in the figure.

In some embodiments, the PB can be connected to the projector through the pogo pins and the projector can be connected to the power adapter. Thus, the projector can charge the PB. In this scenario, both of the projector and the PB can detect that the voltage of the interface Pin3 is greater than about 3V (indicating the projector is connected to the PB). Further, the projector can detect that DC_IN=20 (indicating the projector is connected to the power adapter). Thus, the PB can switch its power pogo pins Pin4 and Pin5 to a current input state, and the projector can switch its power pogo pins Pin4 and Pin5 to a current output state. As such, the projector can supply power to the PB, so that the projector can operate and charge the PB simultaneously.

Accordingly, the projector can be connected to the first power supply unit through the adaptation unit to acquire electric power, or be connected to the second power supply unit through the interface unit. Further, the projector can, through the control unit, detect whether the adaptation unit is connected with the first power supply unit, and can, through the interface unit, detect whether the connection with the second power supply unit is established. Thus, the second power supply having a power storage function can be controlled. As such, based on a present situation of the connections with the power supply units, the projector can determine whether to acquire electric power from the first power supply unit or from the second power supply unit. Therefore, a time of endurance of the electronic device can be improved.

In some embodiments, when the adaptation unit does not acquire electric power from the first power supply unit, and the second power supply unit is connected with the interface unit, the projector can be powered by the second power supply unit.

When the first detection result indicates that no power is acquired from the first power supply unit and the second detection result indicates that the connection with the second power supply unit is established, the control unit can generate a second control instruction for controlling the acquisition of power from the second power supply unit through the interface unit.

Figure 17:
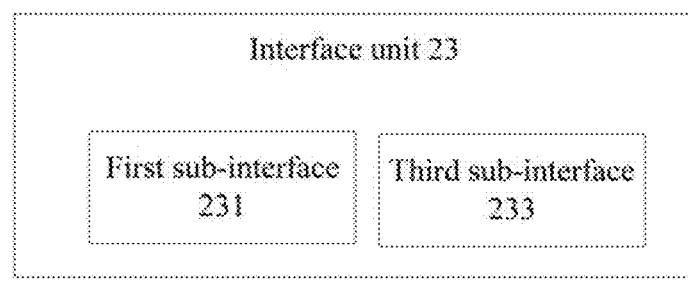
FIG. 17 illustrates a schematic block diagram of another example of interface unit in accordance with some embodiments.

Referring to FIG. 17, a schematic block diagram of another example of the interface unit 23 is shown in accordance with some other embodiments.

As illustrated in FIG. 17, the interface unit 23 can include at least the first sub-interface 231 and a third sub-interface 233.

The first sub-interlace 231 can be configured for detecting whether the connection with the second power supply unit is established.

The third sub-interface 233 can be configured for acquiring electric power from the second power supply unit.

In addition, the interface unit 23 can further include a fourth sub-interface and/or a fifth sub-interface for grounding.

Further, the third sub-interface 233 and the second sub-interface 232 described above in connection with FIG. 13 can be physically a same sub-interface or different sub-interfaces, which are not limited here.

Further, the first sub-interface can use a voltage parameter to detect whether the connection with the second power supply unit is established. For example, when a voltage detected by the first sub-interlace is about 3V, it can be determined that a connection to the second power supply unit is established. Otherwise, it can be determined that there is no connection to the second power supply unit.

The application scenario for the example of the interface unit 23 shown in FIG. 17 can also include the example of application scenario shown in FIGS. 14-16. As illustrated in FIG. 14, the application scenario can include three parts, i.e., the projector, the battery, i.e., the PB, and the power adapter. The power adapter can be used to power the projector.

As shown in FIG. 15, the projector can include five pogo pins. The projector can charge the PB through the pogo pins, and can also be powered by the PB to operate when there is no power adapter.

The PB can include five pogo pins corresponding to the five pogo pins of the projector. Through the coupling between the pogo pins of the PB and the pogo pins of the projector, the PB can supply power to the projector, or be charged by the projector.

In some embodiments, as shown in FIG. 15, the projector includes a total of five interfaces. The interface Pin1 and the interface Pin2 can be grounded (GND). The interface Pin3 can be used as the first sub-interface to detect whether the projector is connected with the PB. The interface Pin4 and/or the interface Pin5 can be used as the third sub-interface for obtaining power from the PB.

Referring to FIG. 16, a schematic structural diagram of an example of interface unit is shown in accordance with some embodiments.

As illustrated in FIG. 16, the interface unit includes a plurality of sub-interfaces 51, each of which can include a metal pin with a diameter of about 1 mm and a length of about 6 mm. The sub-interfaces 51 can be fixed by a plastic bracket 52 to a printed circuit board (PCB), and can be connected to a main control board via cables 53. In the example shown in FIG. 16, the PCB is inside the plastic bracket 52 and is therefore not shown in the figure.

In some embodiments, the PB can be connected to the projector through the pogo pins and the projector is not connected to the power adapter. Thus, the PB can charge the projector. In this scenario, both of the projector and the PB can detect that the voltage of the interface Pin3 is greater than about 3V (indicating the projector is connected to the PB). Further, the projector can detect that DC_IN=0 (indicating the projector is not connected to the power adapter). Thus, the PB can switch its power pogo pins Pin4 and Pin5 to a current output state, and the projector can switch its power pogo pins Pin4 and Pin5 to a current input state. As such, the projector receive power from the PB, so that the projector can operate normally.

Examples of the interface logic control is listed in Table 1 below. In some embodiments, the projector can include seven pogo pins, two of which are system pogo pins (system interfaces). The two system pogo pins can be defined as in a cut-off state.

TABLE 1

| Scenario | Projector connected to second power supply unit | Projector connected to second power supply unit |
| --- | --- | --- |
| Statuses of detection interface (first sub-interface) and adaptation unit | Voltage of first sub-interface >3 V; Voltage of adaptation unit = 20 V | Voltage of first sub-interface >3 V; Voltage of adaptation unit = 0 V |
| Electric current state of projector | Charge PB | Receive power supply from PB |
| Electric current input and output status of system interface | Cut-off | Cut-off |
| Electric current state of PB | Receive power supply from projector | Supply power to projector |

Accordingly, the projector can be connected to the first power supply unit through the adaptation unit to acquire electric power, or be connected to the second power supply unit through the interface unit. Further, the projector can, through the control unit, detect whether the adaptation unit is connected with the first power supply unit, and can, through the interface unit, detect whether the connection with the second power supply unit is established. Thus, the second power supply having a power storage function can be controlled. As such, based on a present situation of the connections with the power supply units, the projector can determine whether to acquire electric power from the first power supply unit or from the second power supply unit. Therefore, a time of endurance of the electronic device can be improved.

Figure 18:
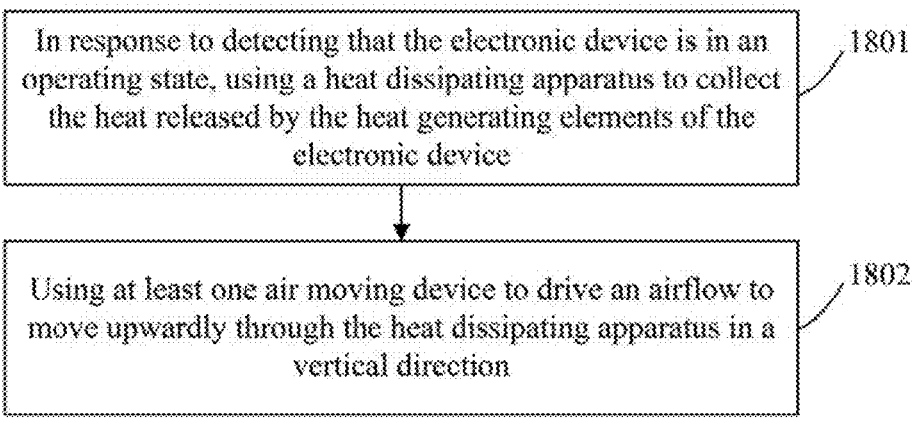
FIG. 18 illustrates a schematic flow diagram of an example of method for heat dissipating of an electronic device in accordance with some embodiments.

Referring to FIG. 18, a schematic flow diagram of an example of method for heat dissipating of an electronic device is shown in accordance with some embodiments.

As illustrated in FIG. 18, at 1801: in response to detecting that the electronic device is in an operating state, using a heat dissipating apparatus to collect the heat released by the heat generating elements of the electronic device.

For example, the electronic device may be referred to as being in the operating state during the period of time after the electronic device is turned on and before the electronic device is turned off or put into hibernation.

At 1802: using at least one air moving device to drive an airflow to move upwardly through the heat dissipating apparatus in a vertical direction.

In some embodiments, the at least one air moving device can include a first air moving device, and/or a second air moving device.

In some embodiments, the airflow can be driven by the first air moving device to move upwardly through the heat dissipating apparatus in the vertical direction, and/or be driven by the second air moving device to move upwardly through the heat dissipating apparatus in the vertical direction.

In some embodiments, a first rotational speed of the first air moving device can be determined based on an amount of collected heat. The first air moving device can drive the cold air upwardly in the vertical direction based on the determined first rotational speed. The cold air can enter the electronic device through a ventilation hole located at a first end of the electronic device.

Correspondingly, a second rotational speed of the second air moving device can be determined according to the first rotational speed of the first air moving device. The second air moving device can drive the airflow to the outside of the electronic device based on the determined second rotational speed, such that the airflow can be discharged through another ventilation hole located at a second end of the electronic device.

Therefore, the rotational speeds of the first air moving device and the second air moving device can be adjusted according to the amount of the heat, thereby saving the power consumption of the air moving devices.

The disclosed method for heat dissipating can be applied to any suitable electronic device having one or more heat generating elements.

According to the disclosed method for heat dissipating, heat released by the heat generating elements when the electronic device is in the operating state can be absorbed and dissipated quickly.

Figure 19:
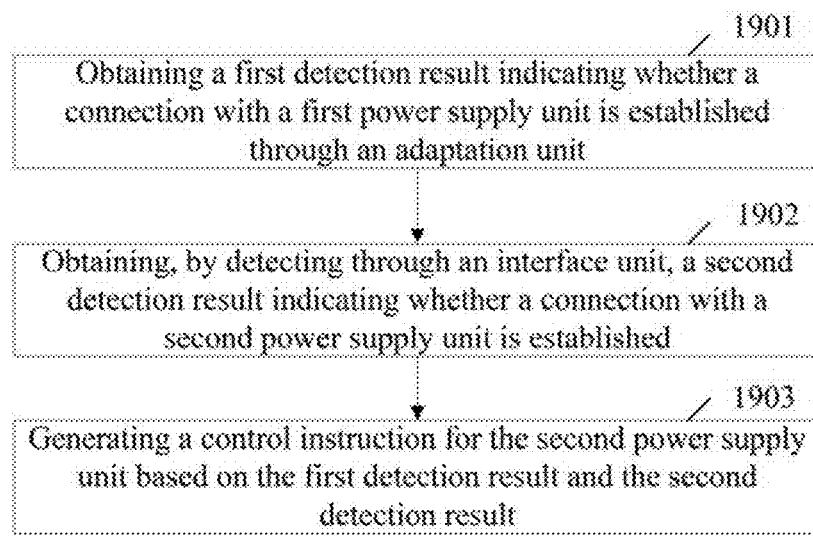
FIG. 19 illustrates a schematic flow diagram of an example of method for controlling an electronic device in accordance with some embodiments.

Referring to FIG. 19, a schematic flow diagram of an example of method for controlling an electronic device is shown in accordance with some embodiments. The electronic device includes at least a projector capable of projecting an output image onto a projection surface using light emitted by a light source, and acquiring electric power through an adaptation unit or acquiring power from a second power supply unit.

As illustrated in FIG. 19, at 1901, a first detection result indicating whether a connection is established with a first power supply unit through the adaptation unit can be obtained.

At 1902, a second detection result indicating whether a connection is established with a second, power supply unit can be obtained through an interface unit. The first power supply unit can be different from the second power supply unit. The first power supply unit can be a power supply unit having a voltage conversion function. The second power supply unit can be a power supply unit at least having a power storage function.

At 1903, a control instruction directed to the second power supply unit can be generated based on the first detection result and the second detection result.

In some embodiments, the first power supply unit may be a power supply unit that supplies electric power through an AC electrical interface. For example, the first power supply unit can provide a 220V AC power.

In some embodiments, the second power supply unit may be a power storage device, such as a power bank. The second power supply unit may have charging and discharging functions.

Further, the detection of whether the adaptation unit 22 obtains electric power from the first power supply unit may include a detection on a DC-IN pin of the adaptation unit 22. For example, when DC-IN=0, it can be determined that the adaptation unit 22 is not connected with the first power supply unit. When DC-IN=20, it can be determined that the adaptation unit 22 is connected with the first power supply unit. The unit of DC-IN may be voltage V.

The above processes of the methods shown in FIGS. 18 and 19 can be executed or performed in any order or sequence not limited to the order and sequence shown in the figures. Also, some of the above processes of the methods shown in FIGS. 18 and 19 can be executed or performed substantially simultaneously where appropriate or in parallel to reduce latency and processing times. Furthermore, FIGS. 18 and 19 are provided as examples only. At least some of the processes shown in the figures may be performed in a different order than represented performed concurrently, or omitted.

In some embodiments, when the adaptation unit does not acquire electric power from the first power supply unit, and the second power supply unit is connected with the interface unit, the projector can be powered by the second power supply unit.

When the first detection result indicates that power is not acquired from the first power supply unit and the second detection result indicates that the connection with the second power supply unit is established, the control unit can generate the second control instruction for controlling the acquisition of power from the second power supply unit through the interface unit.

The application scenario for the example of method shown in FIG. 19 can also include the example of application scenario shown in FIGS. 14-16. As illustrated in FIG. 14, the application scenario can include three parts, i.e., the projector, the battery, i.e., the PB, and the power adapter. The power adapter can be used to power the projector.

As shown in FIG. 15, the projector can include five pogo pins. The projector can charge the PB through the pogo pins, and can also be powered by the PB to operate when there is no power adapter.

The PB can include five pogo pins corresponding to the five pogo pins of the projector. Through the coupling between the pogo pins of the PB and the pogo pins of the projector, the PB can supply power to the projector, or be charged by the projector.

In some embodiments, as shown in FIG. 15, the projector includes a total of five interfaces. The interface Pin1 and the interface Pin2 can be grounded (GND). The interface Pin3 can be used as a first sub-interface to detect whether the projector is connected with the PB. The interface Pin4 and/or the interface Pin5 can be used as a second sub-interface for charging the PB or as a third sub-interface for obtaining power from the PB.

Referring to FIG. 16, a schematic structural diagram of an example of interface unit is shown, in accordance with some embodiments.

As illustrated in FIG. 16, the interlace unit includes a plurality of sub-interfaces 51, each of which can include a metal pin with a diameter of about 1 mm and a length of about 6 mm. The sub-interfaces 51 can be fixed by a plastic bracket 52 to a printed circuit board (PCB), and can be connected to a main control board via cables 53. In the example shown in FIG. 16, the PCB is inside the plastic bracket 52 and is therefore not shown in the figure.

In some embodiments, the PB can be connected to the projector through the pogo pins and the projector is not connected to the power adapter. Thus, the PB can charge the projector. In this scenario, both of the projector and the PB can detect that the voltage of the interface Pin3 is greater than about 3V (indicating the projector is connected to the PB). Further, the projector can detect that DC_IN=0 (indicating the projector is not connected to the power adapter). Thus, the PB can switch its power pogo pins Pin4 and Pin5 to a current output state, and the projector can switch its power pogo pins Pin4 and Pin5 to a current input state. As such, the projector receive power from the PB, so that the projector can operate normally.

Examples of the interface logic control is listed in Table 1 above, in some embodiments, the projector can include seven pogo pins, two of which are system pogo pins (system interfaces). The two system pogo pins can be defined as in a cut-off state.

Accordingly, the projector can be connected to the first power supply unit through the adaptation unit to acquire electric power, or be connected to the second power supply unit through the interface unit. Further, the projector can, through the control unit, detect whether the adaptation unit is connected with the first power supply unit, and can, through the interface unit, detect whether the connection with the second power supply unit is established. Thus, the second power supply having a power storage function can be controlled. As such, based on a present situation of the connections with the power supply units, the projector can determine whether to acquire electric power from the first power supply unit or from the second power supply unit. Therefore, a time of endurance of the electronic device can be improved.

In some embodiments, the at least one heat sink can include a first heat sink and a second heat sink.

The first heat sink can be used for dissipating heat from a first heat generating device of the electronic device. The first heat sink can be detachably and vertically disposed on a vertical system bracket of the electronic device.

The second heat sink can be used for dissipating heat from a second heat generating device of the electronic device. The second heat sink can be detachably and vertically disposed on the vertical system bracket of the electronic device. Further, a system motherboard of the electronic device can also be disposed on the vertical system bracket of the electronic device.

In some embodiments, when the first heat sink and the second heat sink are disposed on the vertical system bracket, the first heat sink, the second heat sink, and the vertical system bracket can form a portion of a vertical columnar electronic device.

In some embodiments, the first heat sink and/or the second heat sink can form a part of a side surface of the vertical system bracket.

In some embodiments, the first heat sink can include at least one first cooling fin. In some embodiments, the first heat sink can include at least two first cooling fins. The at least two first fins can have different heights. Adjacent two first cooling fins can form a duct.

In some embodiments, the second heat sink can include at least one second cooling fin. In some embodiments, the second heat sink can include at least two second cooling fins. The at least two second fins can have different heights. Adjacent two second cooling fins can form a duct.

In some embodiments, a number of first cooling fins in the first heat sink can be equal to a number of second cooling fins in the second heat sink. Each of the first cooling fins in the first heat sink can have a same height as a corresponding second cooling fin in the second heat sink. As such, when the first heat sink and the second heat sink are disposed on the vertical system bracket, a duct can be formed between a pair of adjacent first cooling fin and second cooling fin.

In some embodiments, the first heat sink can be used for cooling the central processing unit of the electronic device. A size of the first heat sink can be adapted to a size of the motherboard of the electronic device;

The second heat sink can be used for cooling the graphics processor of the electronic device. A size of the second heat sink can be adapted to a size of the graphics card of the electronic device.

In some embodiments, a bottom side of the vertical system bracket can have a circular shape or a polygonal shape.

The vertical system bracket can include a first heat sink support piece connected to a bottom edge of a first side of the vertical system bracket for carrying the first heat sink, and a second heat sink support piece connected to a bottom edge of a second side of the vertical system bracket for carrying the second heat sink.

In some embodiments, the first heat sink support piece can include a first placement hole for placing the first heat sink. The second heat sink support piece can include a second placement hole for placing the second heat sink.

In some embodiments, the first heat sink support piece can further include a first mounting hole for mounting the first heat sink on the first heat sink support piece through a thermal pad. The second heat sink support piece can further include a second mounting hole for mounting the second heat sink on the second heat sink support piece through a thermal pad.

In some embodiments, the vertical system bracket can further include a third support piece connected to a bottom edge of a third side of the vertical system bracket for carrying another hardware component of the electronic device.

In some embodiments, a processing apparatus can include the vertical system bracket, a motherboard disposed on the vertical system bracket, and the heat dissipating apparatus disposed on the vertical system bracket.

In some embodiments, an electronic device can include a heat dissipating apparatus configured for, when the electronic device is in an operating state, collecting the heat released by the heat generating elements of the electronic device through at least one heat sink, and using an air moving device to drive an airflow to move upwards through the at least one heat sink in a vertical direction.

In some embodiments, the electronic device can further include a projection apparatus, e.g., a projector, provided over a top of the heat dissipating apparatus. The projection apparatus can be used for acquiring and displaying information of the electronic device that is to be displayed.

In some embodiments, at least one ventilation hole can be provided in each of a first end and a second end of the electronic device. The at least one ventilation hole at the first end can correspond to the first air moving device, and the at least one ventilation hole at the second end can correspond to the second air moving device.

In some embodiments, the electronic device can further include a processing apparatus.

The processing apparatus can include a first transmission module, a first connector for establishing a first signal connection with a second connector in the projection apparatus, and a processor disposed on a motherboard.

The processor can be used for obtaining second identification information of a second transmission module in the projection apparatus through the first signal connection, and establishing a second signal connection with the projection apparatus based on the first identification information of the first transmission module and the second identification information.

In some embodiments, the first transmission module can be configured to transmit a video signal from the first electronic apparatus to the second electronic apparatus through the second signal connection.

In some embodiments, the processor can be configured to write the second identification information into the first transmission module, to read identification information from the first transmission module, to use the read identification information as the second identification information, and to establish the second signal connection based on the first identification information and the second identification information.

In some embodiments, the first connector can be further configured to transmit an electronic current signal through the first signal connection after the first signal connection is established.

In some embodiments, the first transmission module and the second transmission module are wireless high definition (WIHD) transmission modules.

In some embodiments, the projection apparatus can be located at a predetermined position above the processing apparatus.

In some embodiments, the electronic device can further include an adaptation unit, an interface unit, and a control unit.

The adaptation unit can be configure for establishing a connection with a first power supply unit.

The interface unit can be configured for detecting whether a connection with a second power supply unit is established. The first power supply unit can be different from the second power supply unit. The first power supply unit can be a power supply unit having a voltage conversion function. The second power supply unit can be a power supply unit having at least a power storage function.

The control unit can be configured for detecting a first detection result indicating whether the adaptation unit obtains electric power from the first power supply unit, and for obtaining a second detection result from the interface unit indicating whether the connection with the second power supply unit is established. The control unit can be further configured for generating a control instruction directed to the second power supply unit based on the first detection result and the second detection result.

The projection unit can be configured for projecting an output image onto a projection surface using light emitted by a light source, and acquiring electric power through the adaptation unit or acquiring power from the second power supply unit.

In some embodiments, when the first detection result indicates that power is acquired from the first power supply unit and the second detection result indicates that the connection with the second power supply unit is established, the control unit can generate a first control instruction for controlling the charging of the second power supply unit.

In some embodiments, according to the first control instruction, the control unit can divide the electric power obtained from the first power supply unit based on a preset ratio. As such, one portion of the electric power can be used for charging the second power supply through the interface unit.

In some embodiments, the interface unit can include at least a first sub-interface and a second sub-interface.

The first sub-interface can be configured for detecting whether the connection with the second power supply unit is established.

The second sub-interface can be configured for supplying electric power to the second power supply unit to charge the second power supply unit.

In some embodiments, when the first detection result indicates that power is not acquired from the first power supply unit and the second detection result indicates that the connection with the second power supply unit is established, the control unit can generate a second control instruction for controlling acquisition of power from the second power supply unit through the interface unit.

In some embodiments, the interface unit can include at least the first sub-interface and a third sub-interface.

The first sub-interface can be configured for detecting whether the connection with the second power supply unit is established.

The third sub-interface can be configured for acquiring electric power from the second power supply unit.

In some embodiments, in the disclosed heat dissipating method of the heat dissipating apparatus, the first air moving device can drive the airflow to move upwardly through at least one heat sink in a first direction, and the second air moving device can drive the airflow to move upwardly through the at least one heat sink in a vertical direction. The second air moving device can be connected to another end of the at least one heat sink.

In some embodiments, a disclosed controlling method can be applied to an electronic device. The electronic device can include at least a projection unit capable of projecting an output image onto a projection surface using light emitted by a light source, and acquiring electric power through an adaptation unit or acquiring power from a second power supply unit.

The method can include obtaining a first detection result indicating whether a connection with the first power supply unit through the adaptation unit is established, and obtaining a second detection result indicating whether a connection with a second power supply unit is established by detecting through the interface unit. The first power supply unit can be different from the second power supply unit. The first power supply unit can be a power supply unit having a voltage conversion function. The second power supply unit can be a power supply unit at least having a power storage function. A control instruction directed to the second power supply unit can be generated based on the first detection result and the second detection result.

In some embodiments, when the first detection result indicates that power is acquired from the first power supply unit and the second detection result indicates that the connection with the second power supply unit is established, a first control instruction can be generated for controlling the charging of the second power supply unit.

In some embodiments, according to the first control instruction, the electric power obtained from the first power supply unit can be divided based on a preset ratio. As such, one portion of the electric power can be used for charging the second power supply through the interface unit.

In some embodiments, when the first detection result indicates that no power is acquired from the first power supply unit and the second detection result indicates that the connection with the second power supply unit is established, a second control instruction can be generated for controlling the acquisition of power from the second power supply unit through the interface unit.

The disclosed method, apparatus, and electronic device may be implemented in other ways. The embodiments described above are merely illustrative. For example, the division of the units is only based on logical functions. In some actual implementations there may be other division approaches. For example, multiple units or components may be combined, or can be integrated into another system. Some features can be ignored or not be executed. In addition, the coupling, direct coupling, or communication connection of the components shown or described may be realized by electrical or mechanical indirect couplings or communication connections through a number of interfaces, devices or units, or in other forms.

The units described above as separated components may or may not be physically separated. The component for display may or may not be a physical unit. That is, the component for display may be located in one place or may be distributed over a plurality of network elements. A part or all of the elements may be selected according to the actual needs to achieve the purpose of the present disclosure.

In addition, all of the functional units in the disclosed embodiments may be integrated in one processing unit, or each of the functional units may be used as a unit alone, or two or more units may be integrated in one unit. The integrated unit can be achieved in a form of hardware, or in a form of a functional unit combined by hardware and software.

It should be understood by those of ordinary skill in the art that, all or part of the steps of implementing the method embodiments described above may be accomplished by hardware associated with program instructions. The program instructions may be stored in a computer-readable storage medium that, when executed, the steps of the method embodiments described above can be performed. The computer-readable storage medium can include various functions such as a mobile storage device, a read-only memory (ROM), a random access memory (RAM), a disk, an optical disk, or any other suitable media that can store program code.

Alternatively, the above-described integrated units of the present disclosure may be stored in a computer-readable storage medium if it is implemented in a form of a computer application functional module and is sold or used as a separate product. Thus, the technical solution of the embodiments may be embodied in the form of a computer application product. The computer application product can be stored in a storage medium including a number of instructions for controlling a computer device (which may be a personal computer, a server, or a network device, etc.) to perform all or part of a method consistent with the embodiments, such as one of the examples of method described above. The storage medium can include a removable storage device, a ROM, a RAM, a magnetic disk, an optical disk, or any other suitable media that can store program code.

The provision of the examples described herein (as well as clauses phrased as "such as," "e.g.," "including," and the like) should not be interpreted as limiting the disclosure to the specific examples; rather, the examples are intended to illustrate only some of many possible aspects.

Accordingly, a heat dissipating apparatus, a heat dissipating method thereof, and an electronic device are provided.

Although illustrative embodiments are described above, it is understood that the present disclosure has been made only by way of example, and that numerous changes in the details of embodiments can be made without departing from the spirit and scope of the disclosure. Features of the disclosed embodiments can be combined and/or rearranged in various ways. Without departing from the spirit and scope of the disclosure, modifications, equivalents, or improvements to the disclosed embodiments are understandable to those skilled in the art and are intended to be encompassed within the scope of the present disclosure.

What is claimed is:

1. A heat dissipating apparatus, comprising:
   a bracket having a first end, a second end, and a plurality of sidewalls forming a ventilation duct, wherein: the plurality of sidewalls include a first sidewall and a second sidewall, the first sidewall has a first placement hole, the second sidewall has a second placement hole, and the first and second placement holes are arranged at different longitudinal positions along the ventilation duct;
   a first heat sink arranged in the first placement hole and a second heat sink arranged in the second placement hole;
   a first air generating device coupled to the first end of the bracket, the first air generating device driving an airflow to move through the ventilation duct in a direction from the first end to the second end of the bracket; and
   a second air generating device coupled to the second end of the heat sink directly through the second surface of the bracket, the second air generating device driving the airflow to move through the heat sink in the direction.

2. The heat dissipating apparatus of claim 1, wherein:
   each of the first and the second heat sink includes at least one cooling fin.

3. The heat dissipating apparatus of claim 2, wherein:
   each of the first and the second heat sink includes a plurality of cooling fins that have different heights.

4. The heat dissipating apparatus of claim 3, wherein:
   for each of the first and the second heat sink, adjacent ones of the cooling fins are parallel to each other.

5. The heat dissipating apparatus of claim 2, wherein:
   the cooling fin has a flat surface.

6. The heat dissipating apparatus of claim 2, wherein:
   the cooling fin has a curved surface.

7. The heat dissipating apparatus of claim 1, wherein:
   the first air generating device includes a fan; and
   the second air generating device includes a blower.

8. An electronic device, comprising:
   a heat dissipating apparatus including:
     a bracket having a first end, a second end, and a plurality of sidewalls forming a ventilation duct, wherein: the plurality of sidewalls include a first sidewall and a second sidewall, the first sidewall has a first placement hole, the second sidewall has a second placement hole, and the first and second placement holes are arranged at different longitudinal positions along the ventilation duct;
     a first heat sink arranged in the first placement hole and a second heat sink arranged in the second placement hole;
     a first air generating device coupled to the first end of the bracket, the first air generating device driving an airflow to move through the ventilation duct in a direction from the first end to the second end of the bracket; and
     a second air generating device coupled to the second end of the heat sink directly through the second surface of the bracket, the second air generating device driving the airflow to move through the heat sink in the direction; and
   a first heat generating element coupled to the first heat sink; and
   a second heat generating element coupled to the second heat sink.

9. The electronic device of claim 8, wherein:
   the first heat generating element is arranged on an outer surface of the first sidewall of the bracket, and
   the first heat sink is arranged at a position corresponding to the first heat generating element.

10. The electronic device of claim 8, wherein:
    each of the first and the second heat sink includes at least one cooling fin.

11. The electronic device of claim 10, wherein:
    each of the first and the second heat sink includes a plurality of cooling fins that have different heights.

12. The electronic device of claim 11, wherein:
    for each of the first and the second heat sink, adjacent ones of the cooling fins are parallel to each other.

13. The electronic device of claim 11, wherein:
    the cooling fin has a flat surface.

14. The electronic device of claim 11, wherein:
    the cooling fin has a curved surface.

15. The electronic device of claim 8, wherein:
    the first air generating device includes a fan; and
    the second air generating device includes a blower.

16. An electronic device, comprising:
    a light source;
    a projection unit configured to project an output image onto a projection surface using light emitted by the light source; and
    a heat dissipating apparatus including:
      a bracket having a first end, a second end, and a plurality of sidewalls forming a ventilation duct, wherein: the plurality of sidewalls include a first sidewall and a second sidewall, the first sidewall has a first placement hole, the second sidewall has a second placement hole, and the first and second placement holes are arranged at different longitudinal positions along the ventilation duct;

a first heat sink arranged in the first placement hole and a second heat sink arranged in the second placement hole;

a first air generating device coupled to the first end of the bracket, the first air generating device driving an airflow to move through the ventilation duct in a direction from the first end to the second end of the bracket; and a second air generating device coupled to the second end of the heat sink directly through the second surface of the bracket, the second air generating device driving the airflow to move through the heat sink in the direction.

17. The electronic device of claim 16, wherein:
each of the first and the second heat sink includes at least one cooling fin.

18. The electronic device of claim 17, wherein:
each of the first and the second heat sink includes a plurality of cooling fins that have different heights.

19. The electronic device of claim 18, wherein:
for each of the first and the second heat sink, adjacent ones of the cooling fins are parallel to each other.

20. The electronic device of claim 17, wherein:
the cooling fin has a flat surface.

21. The electronic device of claim 16, wherein:
the first air generating device includes a fan; and
the second air generating device includes a blower.

* * * * *